United States Patent [19]

Countryman, Jr.

[11] Patent Number: 4,573,144

[45] Date of Patent: Feb. 25, 1986

[54] COMMON FLOATING GATE PROGRAMMABLE LINK

[75] Inventor: Roger S. Countryman, Jr., Austin, Tex.

[73] Assignee: Motorola, Inc., Schaumburg, Ill.

[21] Appl. No.: 431,935

[22] Filed: Sep. 30, 1982

[51] Int. Cl.[4] ............................................. G11C 11/40
[52] U.S. Cl. .................................................. 365/185
[58] Field of Search .................. 365/185; 357/23 VT, 357/23.5

[56] References Cited

U.S. PATENT DOCUMENTS 4,348,745  9/1982  Schmitz .............................. 365/190
4,479,203 10/1984  Kuo .................................... 365/185

Primary Examiner—James W. Moffitt
Attorney, Agent, or Firm—Anthony J. Sarli, Jr.; Jeffrey Van Myers; James L. Clingan, Jr.

[57] ABSTRACT

A fusible link having a programmable floating gate transistor in a first active region uses an extension of the floating gate to a second active region to provide electrons to the floating gate by the method of tunneling or the method of hot electron injection to avoid applying high voltage to the output terminals of the programmable floating gate transistor.

4 Claims, 8 Drawing Figures

4,573,144

COMMON FLOATING GATE PROGRAMMABLE LINK

CROSS-REFERENCE TO A RELATED APPLICATION

Related subject matter is disclosed in U.S. Pat. application Ser. No. 438,081, entitled "Redundant Memory Circuit," filed Nov. 1, 1982, now U.S. Pat. No. 4,532,611, and assigned to the assignee hereof.

BACKGROUND OF THE INVENTION

This invention relates to floating gate devices, and more particularly to programmable floating gate devices useful as a programmable link to function as a fusible link.

In memory circuits, it has been found that yield can be improved by using redundancy techniques. Accordingly, techniques for implementing redundant rows and columns have been developed. These include links selectively opened by a laser, polysilicon fuses selectively opened by high current, and floating gate transistors selectively programmed by a high voltage. Disadvantages of the laser technique include the large capital investment for the laser equipment and alignment problems due to the relatively large number of alignments which must be made to implement a redundant row or column. Disadvantages of polysilicon fuses include the high current requirement which is very difficult in MOS technology and requires an opening in the passivation layer which consequently requires a further processing step or die coating at the stage the die is assembled into a package. Disadvantages of the floating gate technique include requiring a high voltage for programming and consequently requiring special circuit design to avoid having the high voltage adversely effect the decoder circuit which also receives the high voltage under existing techniques. U.S. patent application Ser. No. 321,855, Kuo, entitled "Electrically Erasable Programmable Read Only Memory Cell," filed Nov. 16, 1981, now U.S. Pat. No. 4,479,203, and assigned to the assignee hereof, describes a technique for erasing a programmed floating gate transistor by extending the floating gate and the control gate of a control transistor to an area which is remote from the programmed transistor to facilitate erasing. The considerations for programming a floating gate transistor, however, are different from those for erasing.

SUMMARY OF THE INVENTION

An object of this invention is to provide an improved floating gate programmable link.

Another object of the invention is to provide two transistors with a common floating gate.

Yet another object of the invention is to program a floating gate transistor in a location which is remote from the floating gate transistor by extending the floating gate to the remote location.

These and other objects of the invention are achieved in one form thereof by providing a programmable link which is comprised of a link transistor and a programming transistor which share a common floating gate. The link transistor has source and drain regions formed in a face of a body of a semiconductor material with a channel region therebetween, and a first portion of said floating gate overlying the channel region and insulated therefrom. The programming transistor has source and drain regions formed in said face with a channel region therebetween, a second portion of said floating gate overlying the channel region and insulated therefrom, and a control gate overlying said second portion of the floating gate and insulated therefrom.

DETAILED DESCRIPTION OF THE DRAWINGS

Figure 1:
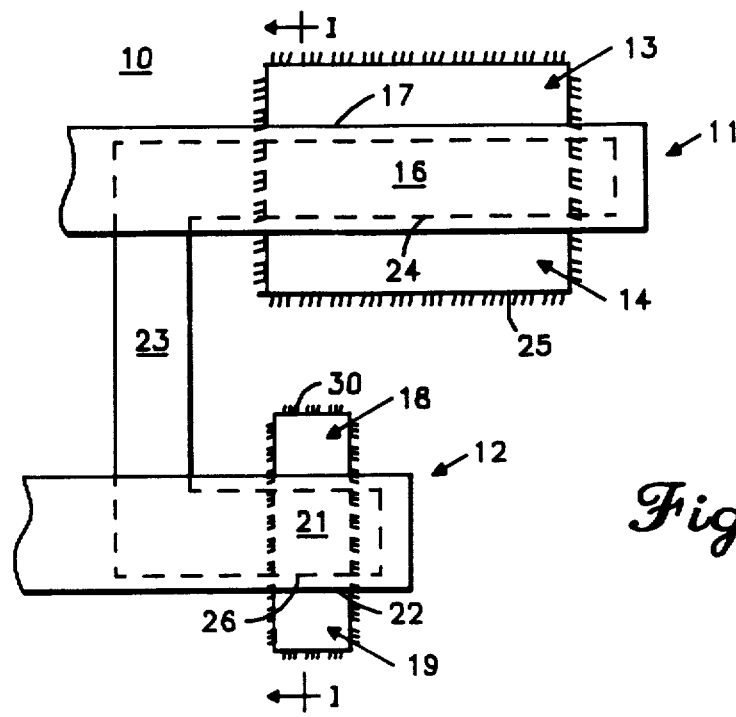
FIG. 1 is a layout of a programmable link device according to one embodiment of the invention.
Figure 2:
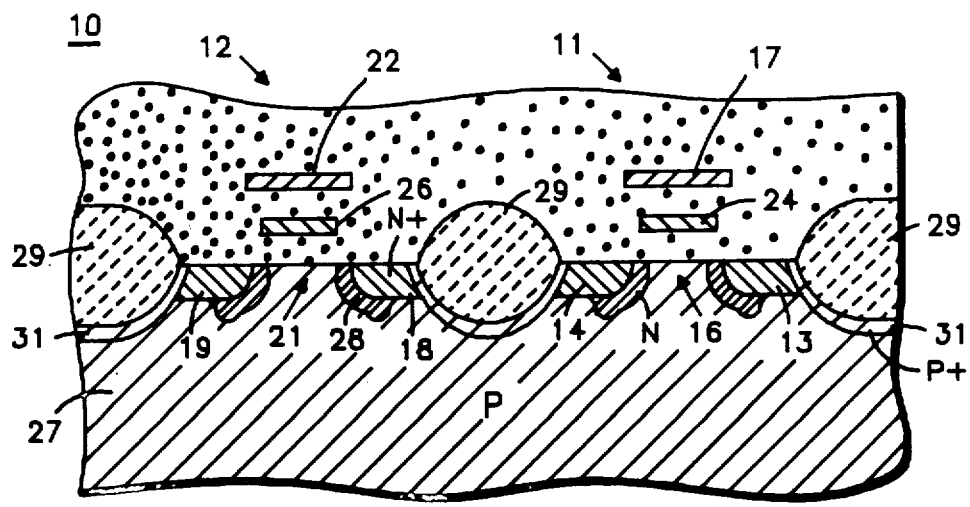
FIG. 2 is a cross section of the device of FIG. 1.
Figure 3:
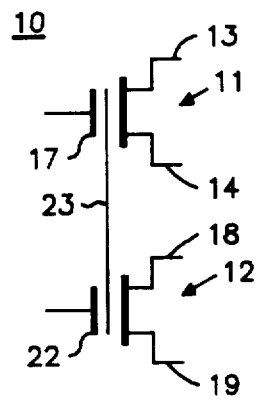
FIG. 3 is a circuit representation of the device of FIG. 1.

Shown in FIG. 1 is a layout of a programmable link 10 according to one embodiment of the invention. The same link 10 is shown in FIG. 3 in circuit diagram form. A cross-section of link 10 taken at I—I of FIG. 1 is shown in FIG. 2. The same reference numerals are used for the same elements. Link 10 is comprised generally of a link transistor 11 and a programming transistor 12. Transistor 11 has a drain region 13, a source region 14, a channel region 16, and a control gate 17. Transistor 12 has a source region 18, a drain region 19, a channel region 21, and a control gate 22. A floating gate 23 has a first portion 24 interposed between channel region 16 and control gate 17 and a second portion 26 interposed between channel region 21 and control gate 22. In a conventional double polysilicon process, floating gate 23 is a first layer of polysilicon insulated from channels 21 and 16 by oxide. Control gates 22 and 17 are formed as part of a second layer of polysilicon and insulated from floating gate 23 by oxide.

FIG. 2 shows that source and drain regions 13, 14, 18 and 19 are formed in a face of a substrate 27 of semiconductor material, typically silicon. Substrate 27 is of P conductivity type with source and drain regions 13, 14, 18 and 19 formed to be N+ by any conventional means. Portions of drain and source regions 13 and 14 and source and drain regions 18 and 19 nearest to channel regions 16 and 21, respectively, are formed to be N in a typical process. A portion 28 of source region 18 is typical. Drain, source, and channel regions 13, 14 and 16 of transistor 11 are formed in an active region 25. Source, drain, and channel regions 18, 19 and 21 of transistor 12 are formed in an active region 30. Active regions 25 and 30 are surrounded by a field oxide 29. Underlying field oxide 29 is a channel stop region 31 formed to be P+. For programming, transistor 12 is used to selectively provide hot electrons for collection by floating gate 23 to program link transistor 11 by adjusting a threshold voltage thereof. In normal operation of the memory, control gate 17 is held at a positive voltage, for example 5 volts, which exceeds the unprogrammed threshold voltage of transistor 11 which is typically approximately 1.0 volt. In which case transistor 11 is turned on to provide a conductive path between drain 13 and source 14. The 5.0 volts applied during normal operation is applied through a conventional load transistor to control gate 17. To program link transistor 11, current is induced between source 18 and drain 19 of transistor 12 while driving control gates 17 and 22 to a high voltage, for example 15 volts, to pull hot electrons to floating gate 23. The high voltage for programming is applied at $V_{PP}$ during a probe stage. This raises the threshold voltage of transistor 11 well above 5 volts so that transistor 11 is turned off during normal operation of the memory when the 5.0 volts is applied to control gate 17. With transistor 11 turned off, there is no longer a current path from drain 13 to source 14 during normal operation. Instead there is effectively an open circuit between drain 13 and source 14.

Figure 4:
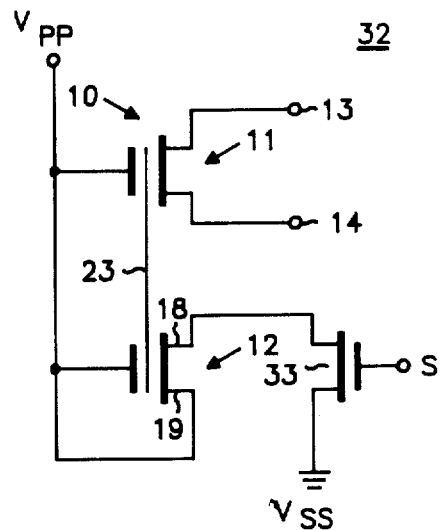
FIG. 4 is a circuit diagram for selectively programming the device of FIG. 1.

Shown in FIG. 4 is a selectably fusible link 32 comprised generally of programmable link 10 and a select transistor 33. Select transistor 33 has a drain connected to source 18 of transistor 12, a source connected to a negative power supply terminal $V_{SS}$, for receiving current, for example ground, and a control gate for receiving a select signal S. Control gate 17, control gate 22, and drain 19 are connected to a programming voltage terminal $V_{PP}$ for receiving a high voltage, for example 15 volts. To select link 32 to provide an open circuit between drain 13 and source 14, signal S is applied to turn on transistor 33. Transistor 33 has a relatively large gain so that there is only a small voltage drop from its drain to source. Most of the voltage drop from $V_{PP}$ to $V_{SS}$ is across transistor 12. Consequently, there are hot electrons flowing through transistor 12 which are pulled to floating gate 23 at portion 26 by the high voltage on control gates 22 and 17. Transistor 11 is then in the programmed state so that it has a higher threshold voltage to prevent it from turning on even when the 5.0 volts of normal operation is present at control gate 17. When a current path between drain 13 and source 14 is desired, select signal S is not applied so that transistor 33 does not turn on which prevents current from flowing through transistor 12. With no current flowing through transistor 12, there are not any hot electrons available to be pulled to floating gate 23. Consequently, transistor 11 will remain in an unprogrammed state so that the threshold voltage remains sufficiently low to allow it to turn on. A selectively interruptable current path is thereby created between drain 13 and source 14 which serve as output terminals. Circuitry involved in implementing redundancy is connected to this selectively interruptable current path. Although a high voltage may be required for selecting between an open or short circuit between drain 13 and source 14, this high voltage is not applied to drain 13 or source 14. Consequently the circuitry which is involved in implementing redundancy need not be subjected to this high voltage, an improvement over the prior art.

Other variations are possible. If transistor 11 is a depletion transistor, a transistor with a negative threshold voltage, a current path will be present between drain 13 and source 14 in the absence of an applied voltage to control gate 17. In the programmed state the threshold is brought to a positive level so that in the absence of an applied voltage to control gate 17 there will not be a current path between drain 13 and source 14. Control gate 17 can thus be eliminated. There is also currently available thin oxide processes so that the oxide shown in FIG. 2 between second portion 26 of floating gate 23 and channel region 21 is very thin, for example 150 Angstroms, which allows Fowler-Nordheim tunneling for programming in place of using hot electrons.

Figure 5:
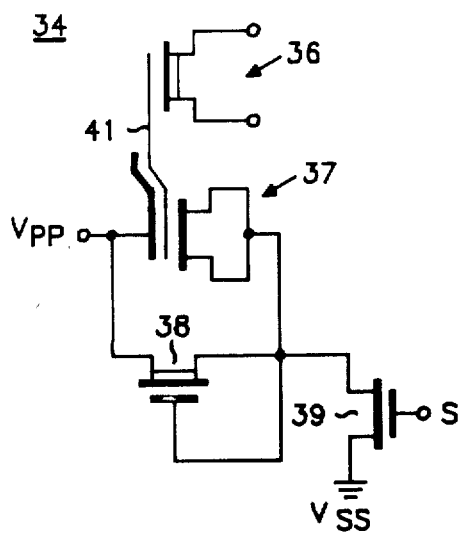
FIG. 5 is a circuit diagram of a selectably fusible link according to a second embodiment of the invention.

Shown in FIG. 5 is a selectably fusible link 34 comprised of a link transistor 36, a programming transistor 37, a load transistor 38, and a select transistor 39. Transistor 36 is analogous to transistor 11 of FIG. 4 but is a depletion transistor and does not have a control gate. Transistor 37 is analogous to transistor 12. A floating gate 41 is analogous to floating gate 23 but has only thin oxide between it and the channel of transistor 37. Transistor 37 has a control gate connected to $V_{PP}$, and a source and a drain connected together. Transistor 38 is a depletion transistor which acts as a load element with resistance having a drain connected to $V_{PP}$, and a gate and a source connected to the drain and source of transistor 37. Transistor 39 has a drain connected to the gate and source of transistor 38 and the source and drain of transistor 37, a control gate for receiving select signal S, and a source connected to $V_{SS}$. To program transistor 36, signal S is applied to the control gate of transistor 39 to turn transistor 39 on to pull the source and drain of transistor 37 to essentially $V_{SS}$. With a high voltage applied to the control gate of transistor 37, electrons tunnel from the source and drain of transistor 37 to floating gate 41 which has the effect of increasing the threshold voltage of transistor 36 to a positive voltage. With no means to apply a control gate voltage to transistor 36, transistor 36 will consequently turn off, stopping the drain to source current gate of transistor 36. When transistor 36 is to remain unprogrammed to maintain a drain to source current path, signal S is not applied so that transistor 39 does not turn on. With transistor 39 off the high voltage from $V_{PP}$ is coupled through load transistor 38 to the source and drain of transistor 37. Consequently there is no voltage differential between the control gate and the source and drain of transistor 37 to cause electrons to tunnel to floating gate 41. Transistor 36 remains unprogrammed so that it maintains a drain to source current path. The drain and source of transistor 36 thus form a selectively interruptable current path useful for implementing redundancy. Capacitance between the control gate of transistor 37 and floating gate 41 is made relatively large, by conventional means, so that most of the high voltage from $V_{PP}$ will be dropped between floating gate 41 and the source and drain of transistor 37 when signal S is applied instead of being dropped between the control gate of transistor 37 and floating gate 41.

There are memory devices which use a single polysilicon layer process so that a second polysilicon layer is not available. Selectably fusible link 34 can be adapted for a single polysilicon process. Shown in FIG. 6 in schematic form is selectably fusible link 42 comprised generally of a programmable link 43, a load transistor 44, and a select transistor 46. Shown in FIG. 7 is programmable link 43 in layout form having active regions 44, 46 and 47 each surrounded by a field oxide 48. Overlying a portion of each active region 44, 46 and 47 is floating gate 49. A programming portion 51 of floating gate 49 overlies a thin oxide portion 52 of active region 46 where floating gate 49 is insulated from active region 46 by a thin oxide. A portion 53 of active region 46 which does not underlie floating gate 49 is for fabricating a contact 54. Active region 47 forms a link transistor 56 comprised of a drain region 57, a source region 58, and a channel region 59 formed by any conventional means. Transistor 56 is a depletion transistor having a negative threshold voltage in an unprogrammed state.

A program portion 61 of floating gate 49 overlies channel region 59. Active region 44 has a major portion 62 and a minor portion 63. Floating gate 49 has a coupling portion 64 overlying major portion 62 to form a relatively large capacitance therebetween. Minor portion 63 which does not underlie floating gate 49 is for fabricating a contact 66. For N channel technology with a P substrate, active region 44 is doped to be N type. This is to avoid depleting major portion 62 when a positive voltage is applied to contact 66 which would have the adverse effect of reducing the effective capacitance between coupling portion 64 and major portion 62. Portion 64 is insulated from major portion 62 by oxide of conventional thickness. Thin oxide, however, can be used to reduce the area of major portion 62 while retaining the same relatively large capacitance.

To program programmable link 43, a high voltage is developed at major portion 62 of active region 44 with respect to thin oxide portion 52 of active region 46. Most of the high voltage is developed between thin oxide portion 52 and programming portion 51 because of the relatively large capacitance between major portion 62 and coupling portion 64. Consequently, electrons tunnel from active region 46 to floating gate 49 to increase the threshold voltage of transistor 56 to a positive voltage. In the unprogrammed state transistor 56 provides a current path from drain 57 to source 58. When programmed, there is effectively an open circuit between drain 57 and source 58.

Figure 6:
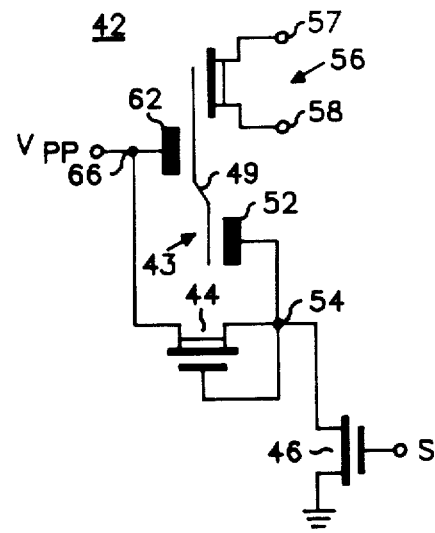
FIG. 6 is a circuit diagram of a selectably fusible link according to a third embodiment of the invention.
Figure 7:
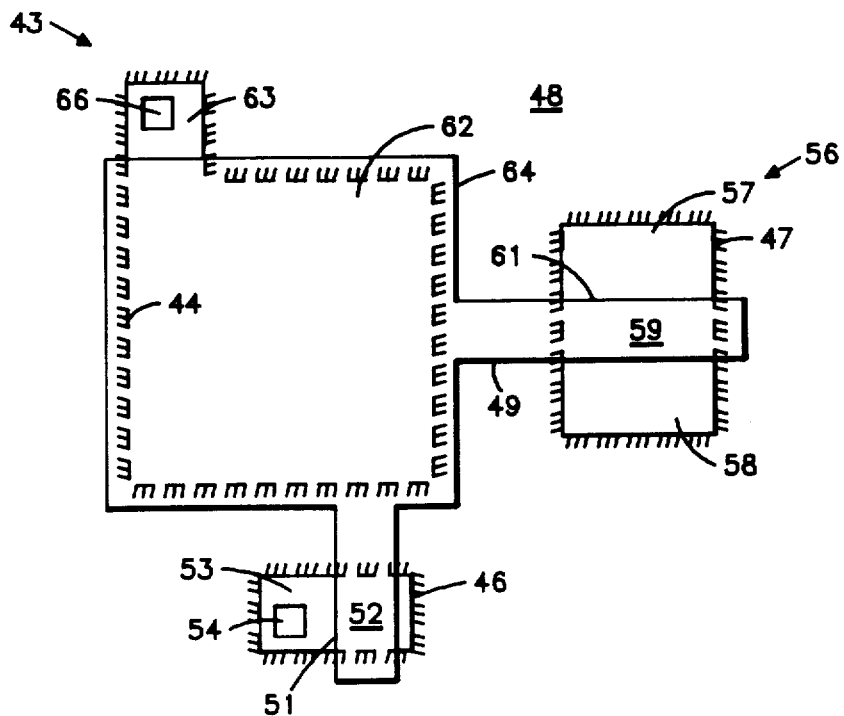
FIG. 7 is a layout of a programmable link which is a portion of the selectably fusible link of FIG. 6.

Selectably fusible link 42 shown in FIG. 6 selectably programs programmable link 43. Depletion transistor 44 has a drain connected to major portion 62 at contact 66, and a gate and a source connected to contact 54. Transistor 46 has a drain connected to contact 54, a source connected to $V_{SS}$, and a gate for receiving select signal S. To program, a high voltage is applied at $V_{PP}$ while select signal S is applied to transistor 46 holding thin oxide portion 52 to the voltage at $V_{SS}$. Electrons then tunnel to floating gate 49 which causes the threshold voltage of transistor 56 to increase to a positive voltage which prevents a current path between drain 57 and source 58. To prevent programming while a high voltage is present at $V_{PP}$, signal S is not applied to transistor 46 so that the high voltage is coupled to contact 54 via load transistor 44. With no voltage differential developed between floating 49 and thin oxide portion 52, electrons are pulled to floating gate 49 so that transistor 56 will continue to provide a current path between drain 57 and source 58.

Figure 8:
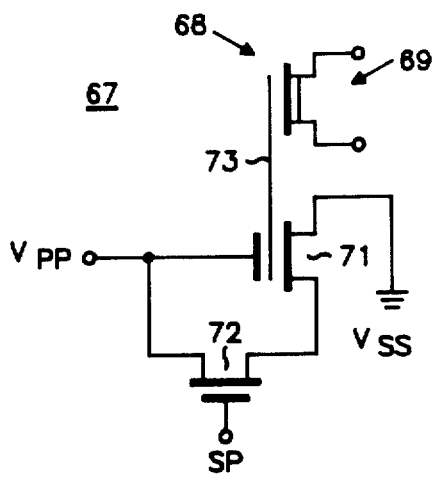
FIG. 8 is a circuit diagram of a selectable fusible link according to a fourth embodiment of the invention.

Yet other examples for providing a selectably fusible link are also possible. One such other example, shown in FIG. 8 is a selectably fusible link 67 for programming a programming link 68 similar to programming link 10 shown in FIG. 3 by hot electron injection. Programming link 68 comprises a link transistor 69 and a programming transistor 71. Transistors 69 and 71 are constructed in the same manner as transistors 11 and 12 of FIG. 3 except link transistor 69 is depletion and without a control gate. Transistor 69 has a source, a drain a floating gate 73 in common with transistor 71. Transistor 71 has a source connected to $V_{SS}$, a control gate connected to $V_{PP}$, and a drain. Selectably fusible link 67 has a control transistor 72 with a drain connected to $V_{PP}$, a source connected to the drain of transistor 71, and a gate for receiving a high voltage select signal SP. To program, a high voltage is applied at $V_{PP}$ while high voltage select signal SP is applied to transistor 72. Current thus flowing through transistor 71 produces hot electrons which are collected by floating gate 73 which in turn causes transistor 69 to increase in threshold voltage. The increase in threshold voltage is sufficient to prevent current from flowing between the drain and source of transistor 69. Signal SP must be a high voltage to prevent transistor 72 from developing a significant voltage thereacross. If SP is not applied, transistor 72 will be off, preventing current from flowing through transistor 71. With no hot electrons available for floating gate 73 to collect, the threshold voltage of transistor 69 will remain negative so that a current path will remain between the source and drain thereof. Having the source of transistor 71 connected to $V_{SS}$ avoids the likely increase in threshold voltage due to body effect in the case of analogous programming transistor 12 of FIG. 4 which has its source connected to transistor 33 for selectively providing a current path to $V_{SS}$. Unless transistor 33 is made very large, there will be some voltage drop thereacross due to the large currents required for hot electron injection.

While the invention has been described in several embodiments, it will be apparent to those skilled in the art that the disclosed invention may be modified in numerous additional ways and may assume many other embodiments other than those specifically set out and described above. Accordingly, it is intended by the appended claims to cover all modifications of the invention which fall within the true spirit and scope of the invention.

I claim:

1. A programmable link, comprising:
   a link transistor having source and drain regions formed in a face of a body of a semiconductor material with a channel region therebetween, a floating gate on said face having a first portion which overlies said channel region and is insulated therefrom, and a control gate overlying said first portion of the floating gate and insulated therefrom;
   a programming transistor having source and drain regions formed in said face with a channel region therebetween, a second portion of said floating gate overlying the channel region and insulated therefrom, and a control gate overlying said second portion of the floating gate and insulated therefrom; and
   a select transistor having a drain coupled to the source region of the programming transistor, a source coupled to a first power supply terminal, and a gate for receiving a select signal; and
   wherein the control gate of the link transistor and the control gate and the drain of the programming transistor are coupled to a second power supply terminal.

2. A programmable link, comprising:
   a link transistor having source and drain regions formed in a face of a body of a semiconductor material with a channel region therebetween, a floating gate on said face having a first portion which overlies said channel region and is insulated therefrom, and a control gate overlying said first portion of the floating gate and insulated therefrom;
   a programming transistor having source and drain regions formed in said face with a channel region therebetween, a second portion of said floating gate overlying the channel region and insulated therefrom, and a control gate overlying said second portion of the floating gate and insulated therefrom; and a select transistor having a drain coupled to a first power supply terminal, a source coupled to the drain region of the programming transistor, and a gate for receiving a select signal; and wherein the control gate of the programming transistor and the control gate of the link transistor are coupled to the first power supply terminal, and the source region of the programming transistor is coupled to a second power supply terminal.

3. A programmable link, comprising:

a link transistor having source and drain regions formed in a face of a body of a semiconductor material with a channel region therebetween, and a floating gate on said face having a first portion which overlies said channel region and is insulated therefrom;

a programming transistor having source and drain regions formed in said face with a channel region therebetween, a second portion of said floating gate overlying the channel region and insulated therefrom, and a control gate overlying said second portion of the floating gate and insulated therefrom; and a select transistor having a drain coupled to the source region of the programming transistor, a source coupled to a first power supply terminal, and a gate for receiving a select signal; and wherein the control gate and the drain of the programming transistor are coupled to a second power supply terminal.

4. A programmable link, comprising:

a link transistor having source and drain regions formed in a face of a body of a semiconductor material with a channel region therebetween, and a floating gate on said face having a first portion which overlies said channel region and is insulated therefrom;

a programming transistor having source and drain regions formed in said face with a channel region therebetween, a second portion of said floating gate overlying the channel region and insulated therefrom, and a control gate overlying said second portion of the floating gate and insulated therefrom; and a select transistor having a drain coupled to a first power supply terminal, a source coupled to the drain region of the programming transistor, and a gate for receiving a select signal; and wherein the control gate of the programming transistor is coupled to the first power supply terminal, and the source region of the programming transistor is coupled to a second power supply terminal.

* * * * *